United States Patent
Noh et al.

(10) Patent No.: US 11,961,824 B2
(45) Date of Patent: Apr. 16, 2024

(54) SEMICONDUCTOR PACKAGE INCLUDING STACKED CHIP STRUCTURE

(71) Applicant: SAMSUNG ELECTRONICS CO., LTD., Suwon-si (KR)

(72) Inventors: Hyunggyun Noh, Suwon-si (KR); Sangwoo Pae, Suwon-si (KR); Jinsoo Bae, Seongnam-si (KR); Iljoo Choi, Anyang-si (KR); Deokseon Choi, Hwaseong-si (KR); Keunho Rhew, Seoul (KR)

(73) Assignee: Samsung Electronics Co., Ltd. (KR)

(*) Notice: Subject to any disclaimer, the term of this patent is extended or adjusted under 35 U.S.C. 154(b) by 178 days.

(21) Appl. No.: 17/680,877

(22) Filed: Feb. 25, 2022

(65) Prior Publication Data

US 2023/0028943 A1 Jan. 26, 2023

(30) Foreign Application Priority Data

Jul. 22, 2021 (KR) .................. 10-2021-0096420

(51) Int. Cl.
*H01L 23/31* (2006.01)
*H01L 23/00* (2006.01)
*H01L 25/065* (2023.01)

(52) U.S. Cl.
CPC ...... *H01L 25/0657* (2013.01); *H01L 23/3121* (2013.01); *H01L 24/13* (2013.01); *H01L 24/14* (2013.01); *H01L 24/32* (2013.01); *H01L 24/48* (2013.01); *H01L 24/49* (2013.01); *H01L 24/73* (2013.01); *H01L 25/0652* (2013.01); *H01L 2224/13018* (2013.01); *H01L 2224/1412* (2013.01); *H01L 2224/32145* (2013.01); *H01L 2224/32225* (2013.01); *H01L 2224/33181* (2013.01); *H01L 2224/48227* (2013.01); *H01L 2224/4912* (2013.01); *H01L 2224/73215* (2013.01); *H01L 2224/73265* (2013.01);
(Continued)

(58) Field of Classification Search
CPC .......... H01L 24/13; H01L 24/14; H01L 24/48
See application file for complete search history.

(56) References Cited

U.S. PATENT DOCUMENTS 6,031,281 A 2/2000 Kang et al.
7,449,770 B2 11/2008 Lin et al.
(Continued)

FOREIGN PATENT DOCUMENTS

KR 10-1992-0010798 A 6/1992
KR 10-1999-0041097 A 6/1999

*Primary Examiner* — Walter H Swanson
(74) *Attorney, Agent, or Firm* — Fish & Richardson P.C.

(57) ABSTRACT

A semiconductor package includes; a package substrate including an upper surface with a bonding pad, a lower semiconductor chip disposed on the upper surface of the package substrate, wherein an upper surface of the lower semiconductor chip includes a connect edge region including a connection pad and an open edge region including a dam structure including dummy bumps, a bonding wire having a first height above the upper surface of the lower semiconductor chip and connecting the bonding pad and the connection pad, an upper semiconductor chip disposed on the upper surface of the lower semiconductor chip using an inter-chip bonding layer, and a molding portion on the package substrate and substantially surrounding the lower semiconductor chip and the upper semiconductor chip.

20 Claims, 12 Drawing Sheets

(52) U.S. Cl.
CPC ............ *H01L 2225/0651* (2013.01); *H01L 2924/3512* (2013.01)

(56) References Cited

U.S. PATENT DOCUMENTS

| | | |
|---|---|---|
| 8,525,349 B2 | 9/2013 | Song et al. |
| 10,236,276 B2 | 3/2019 | Liu et al. |
| 10,438,883 B2 | 10/2019 | Imafuji |
| 10,772,220 B2 | 9/2020 | Zhou et al. |
| 2014/0061887 A1 | 3/2014 | Okuda et al. |
| 2018/0294251 A1* | 10/2018 | Liu .................. H01L 25/0657 |

* cited by examiner

III-III'

VII-VII'

SEMICONDUCTOR PACKAGE INCLUDING STACKED CHIP STRUCTURE

CROSS-REFERENCE TO RELATED APPLICATION

This application claims priority to Korean Patent Application No. 10-2021-0096420 filed on Jul. 22, 2021 in the Korean Intellectual Property Office, the subject matter of which is hereby incorporated by reference in its entirety.

BACKGROUND

The inventive concept relates generally to semiconductor packages, and more particularly, to semiconductor packages including a stacked chip structure.

Consumer demand for electronic devices has dramatically expanded and become increasingly competitive. Thus, demands for greater functionality, reduced size and weight, and longer battery-powered operating life have increased. In order to address these demands, semiconductor packages included in contemporary and emerging electronic devices must be able to process increasingly large quantities of data while maintaining or reducing overall physical size and/or power consumption.

Accordingly, higher degrees of integration within semiconductor packages including multiple semiconductor chips are necessary, and such semiconductor packages often include stacked semiconductor structure(s) that efficiently arrange semiconductor chips in increasingly limited amounts of available space.

SUMMARY

Embodiments of the inventive concept provide semiconductor packages having maintained reliability while efficiently arranging a plurality of semiconductor chips on a package substrate.

According to an aspect of the inventive concept, a semiconductor package may include; a package substrate including an upper surface, bonding pads arranged on the upper surface of the package substrate, a lower semiconductor chip disposed on the upper surface of the package substrate, wherein an upper surface of the lower semiconductor chip includes a connect edge region and an open edge region, connection pads arranged on the upper surface of the lower semiconductor chip in the connect edge region, bonding wires respectively connecting the bonding pads and the connection pads, a dam structure including dummy bumps disposed in the open edge region and dummy wires extending between adjacent ones of the dummy bumps, an upper semiconductor chip disposed on the upper surface of the lower semiconductor chip, an inter-chip bonding layer between the lower semiconductor chip and the upper semiconductor chip, and a molding portion on the package substrate and substantially surrounding the lower semiconductor chip and the upper semiconductor chip.

According to another aspect of the inventive concept, a semiconductor package may include; a package substrate including an upper surface with a bonding pad, a lower semiconductor chip disposed on the upper surface of the package substrate, wherein an upper surface of the lower semiconductor chip includes a connect edge region including a connection pad and an open edge region including a dam structure, a bonding wire having a first height above the upper surface of the lower semiconductor chip and connecting the bonding pad and the connection pad, an upper semiconductor chip disposed on the upper surface of the lower semiconductor chip using an inter-chip bonding layer, and a molding portion on the package substrate and substantially surrounding the lower semiconductor chip and the upper semiconductor chip, wherein the dam structure includes dummy bumps disposed in the open edge region, and dummy wires extending between adjacent ones of the dummy bumps and having a second height above the upper surface of the lower semiconductor chip.

According to another aspect of the inventive concept, a semiconductor package may include; a package substrate including an upper surface including bonding pads, a lower semiconductor chip disposed on the upper surface of the package substrate, wherein an upper surface of the lower semiconductor chip includes a connect edge region including connection pads and an open edge region including a dam structure, a spacer chip disposed on the upper surface of the package substrate, an upper semiconductor chip disposed on the upper surface of the lower semiconductor chip and the upper surface of the spacer chip, an inter-chip bonding layer between the upper semiconductor chip and the lower semiconductor chip and the spacer chip, bonding wires respectively connecting the bonding pads and the connection pads, and a molding portion on the package substrate and substantially surrounding the lower semiconductor chip, the spacer chip and the upper semiconductor chip, wherein the dam structure includes at least two dummy bumps and at least one dummy wire connecting the at least two dummy bumps.

BRIEF DESCRIPTION OF DRAWINGS

The making and use of the inventive concept may be more clearly understood upon consideration of the following detailed description together with the accompanying drawings, in which.

DETAILED DESCRIPTION

Throughout the written description and drawings, like reference numbers and labels are used to denote like or similar elements, components, method steps and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
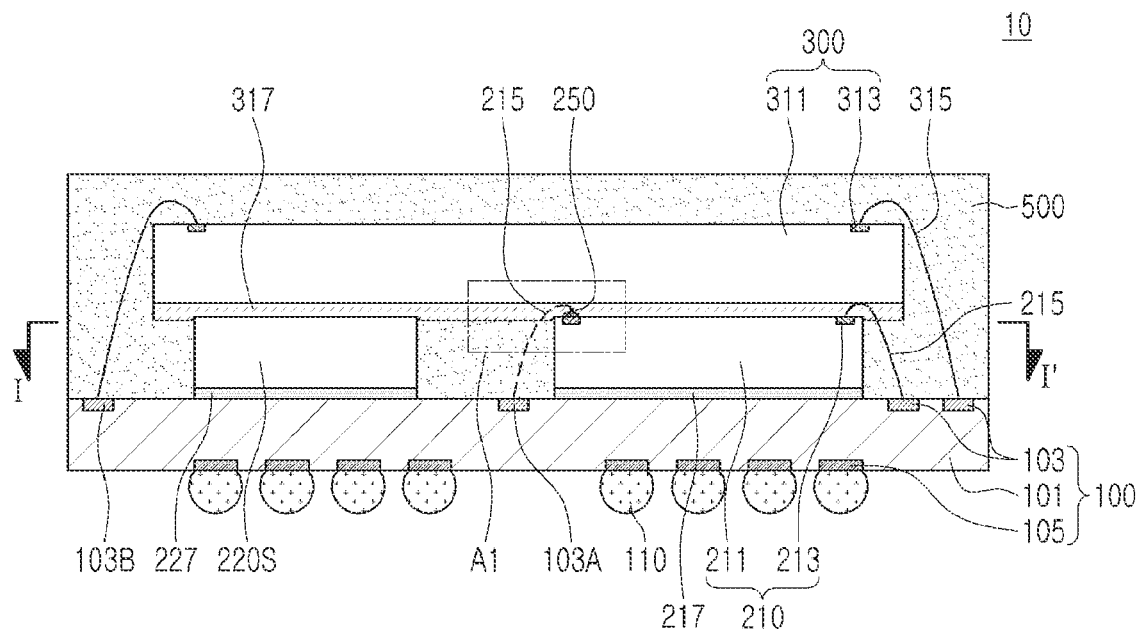
FIG. 1 is a cross-sectional view of a semiconductor package according to embodiments of the inventive concept.
Figure 2:
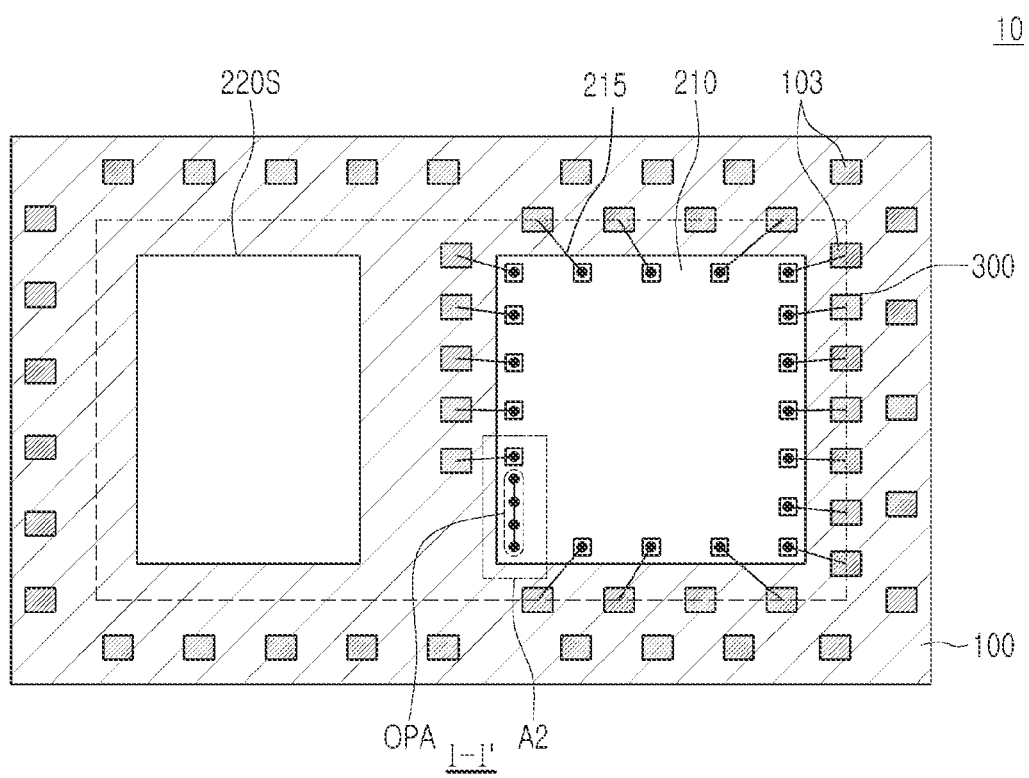
FIG. 2 is a plan (or top-down) view of the semiconductor package of FIG. 1 taken along line I-I'.

FIG. 1 is a cross-sectional side view of a semiconductor package 10 according to embodiments of the inventive concept, and FIG. 2 is a plan view of the semiconductor package 10 taken along line I-I'.

Referring to FIGS. 1 and 2, the semiconductor package 10 may include a package substrate 100, a first (or lower) semiconductor chip 210 disposed on the package substrate 100, a spacer chip 220S, and a second (or upper) semiconductor chip 300 disposed on the lower semiconductor chip 210 and the spacer chip 220S. Here, FIG. 2 particularly illustrates the disposition of the lower semiconductor chip 210 and the spacer chip 220S on the package substrate 100 with the disposition of the upper semiconductor chip 300 shown only in dotted outline.

The package substrate 100 may include a body 101, upper (or bonding) pads 103 on an upper surface of the body 101, and lower pads 105 on a lower surface of the body 101. The package substrate 100 may also include wiring pattern(s) and connection via(s) (not shown in FIGS. 1 and 2) that may be used to variously connect upper pads 103 and lower pad 105. (In this context, the term "connect" means electrically connected). In some embodiments, at least one of the upper pads 103 and at least one of the lower pads 105 may be used as ground pad(s).

The package substrate 100 may be variously configured and include at least one of a printed circuit board (PCB), a ceramic substrate, an interposer, a redistribution layer (RDL), etc. In some embodiments, the package substrate 100 may include a multilayer PCB. In some embodiments, the body 101 of the package substrate 100 may include at least one material such as phenol resin, epoxy resin, polyimide, frame retardant 4 (FR4), tetrafunctional epoxy, polyphenylene ether, epoxy/polyphenylene oxide, bismaleimide triazine (BT), cyanate ester, polyimide, liquid crystal polymer, etc. Further, one or more of the upper pads 103, the lower pads 105, wiring pattern(s), and/or connection via(s) may include at least one metal such as copper (Cu), nickel (Ni), aluminum (Al), beryllium copper, etc.

One or more external connection terminal(s) 110 may be respectively formed on lower pad(s) 105 of the package substrate 100. Each external connection terminal 110 may include, for example, at least one of a solder ball, a conductive bump, a conductive paste, a ball grid array (BGA), a lead grid array (LGA), and a pin grid array (PGA).

The lower semiconductor chip 210 may include a semiconductor substrate 211 having an active (or upper) surface and an opposing inactive (or lower) surface. (Of note, the relative terms "upper" and "lower" may refer to different surfaces of the semiconductor substrate 211 during fabrication processing of the lower semiconductor chip 210 and before the lower semiconductor chip 210 is "flipped" during mounting of the lower semiconductor chip 210 on the package substrate 100). (In this context, the term "mount" means at least one of electrically connecting and/or mechanically assembling).

In some embodiments, the upper surface of the semiconductor substrate 211 may include (e.g., be populated with) various passive element(s) (e.g., resistor(s), capacitor(s) and/or inductor(s)), and/or active elements (e.g., transistor(s)). In this regard, one or more connection pads 213 on the lower surface of the semiconductor substrate 211 may be variously connected.

In some embodiments, the mounting of the lower semiconductor chip 210 on the package substrate 100 may be accomplished by bonding the upper surface of the semiconductor substrate 211 with an upper surface of the package substrate 100 using a first adhesive layer 217. In this regard, the lower semiconductor chip 210 may be variously connected to the package substrate 100 using one or more bonding wire(s) 215. For example, the bonding wires 215 may be used to respectively interconnect connection pads 213 of the lower semiconductor chip 210 and upper pads 103 of the package substrate 100.

Analogous to the lower semiconductor chip 210, the upper semiconductor chip 300 may include a semiconductor substrate 311 including an active surface and an opposing inactive surface, as well as connection pads 313. Further, analogous to the lower semiconductor chip 210, the upper semiconductor chip 300 may be variously connected to the package substrate 100 by wire(s) 315. For example, the wires 315 may interconnect the connection pads 313 of the upper semiconductor chip 300 and the upper pads 103 of the package substrate 100.

Hence, the upper semiconductor chip 300 may be bonded to the upper surface of the lower semiconductor chip 210 and an upper surface of the spacer chip 220S using an inter-chip bonding layer 317. In some embodiments, the inter-chip bonding layer 317 may first be applied to the lower surface of the upper semiconductor chip 300, and then the lower surface of the upper semiconductor chip 300 may be bonded to the upper surface of the lower semiconductor chip 210 as well as the upper surface of the spacer chip 220S.

In some embodiments, the inter-chip bonding layer 317 may include at least one of an adhesive resin, a non-conductive film (NCF), a direct adhesive film (DAF), and/or a film over wire (FOW). Here, the adhesive resin layer may include at least one of a bisphenol-type epoxy resin, a novolak-type epoxy resin, a phenol resin, a urea resin, a melamine resin, an unsaturated polyester resin and a resorcinol resin. The inter-chip bonding layer 317 may have a relatively constant thickness, such that the inter-chip bonding layer substantially covers at least some portion (e.g., an upper portion) of the bonding wires 215 connecting connection pads 213.

The spacer chip 220S may be disposed as a lower structure—additional to the lower semiconductor chip 210—that further supports and stabilizes the upper semiconductor chip 300. Here, the spacer chip 220S may occupy a relatively smaller lateral area than the lower semiconductor chip 210. However, analogous to the lower semiconductor chip 210, the spacer chip 220S may be bonded to an upper surface of the package substrate 100 using a second adhesive layer 227. In some embodiments, the spacer chip 220S may include material(s) substantially similar to those used to fabricate the semiconductor substrate 211 of the lower semiconductor chip 210. For example, the spacer chip 220S may include a silicon (Si) substrate.

In some embodiments, two or more of the first adhesive layer 217, the second adhesive layer 227, and the inter-chip bonding layer 317 may include one or more similar materials.

The semiconductor package 10 of FIGS. 1 and 2 may further include a molding portion 500 substantially surrounding the lower semiconductor chip 210, the spacer chip 220S, and the upper semiconductor chip 300. Thus, the molding portion 500 may protect the lower semiconductor chip 210, the spacer chip 220S, and the upper semiconductor chip 300 from external shocks as well as contamination. In some embodiments, the molding portion 500 may be formed by injecting an appropriate quantity of uncured resin onto the package substrate 100 and then curing the resin. For example, a transfer molding process, including a pressing step that applies a mechanical pressing force to materials being molded, may be used to form the molding portion 500. However, depending on variation(s) in processing conditions (e.g., a delay time between the injection and pressing of the molding resin, viscosity of the molding resin under differing temperature(s) and/or pressure(s), etc.), some amount of injected molding resin may erroneously stray (e.g., undesirably intrude upon) other elements, components and/or spaces between same within the semiconductor package 10.

For example, the molding portion 500 may include an epoxy-group molding resin, a polyimide-group molding resin, an epoxy molding compound (EMC) and/or a high-K epoxy molding compound. And these different materials may react differently under variable processing conditions during the formation of the molding portion 500.

Figure 3:
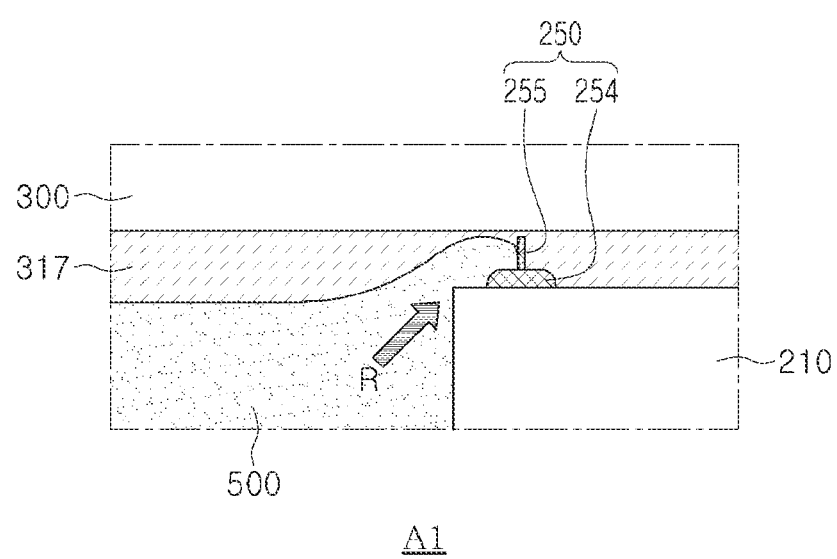
FIG. 3 is an enlarged cross-sectional view of region 'A1' indicated in FIG. 1.
Figure 4A:
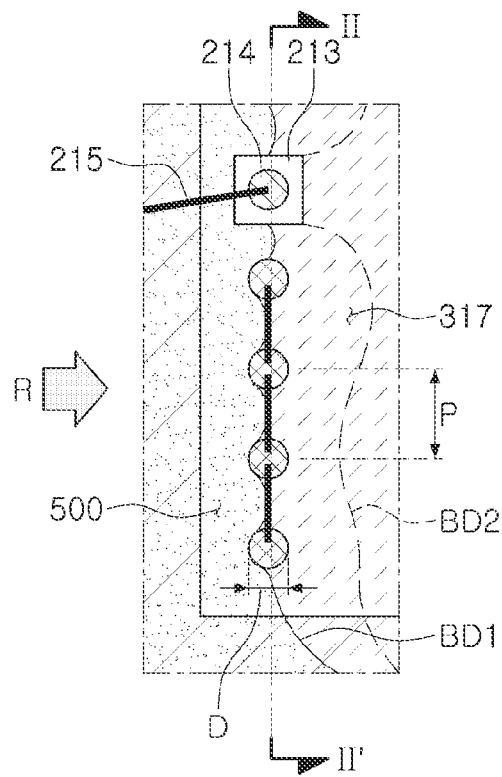
FIG. 4A is an enlarged plan view of region 'A2' indicated in FIG. 2.
Figure 4B:
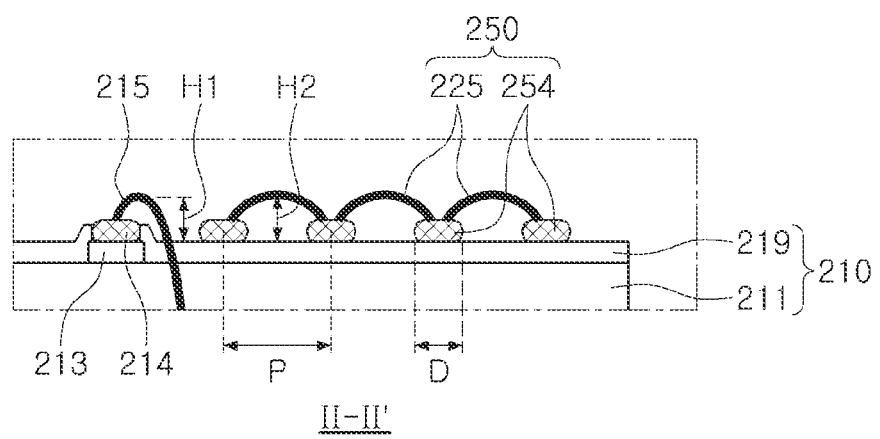
FIG. 4B is a cross-sectional view of region A2 taken along line II-II' of FIG. 4A.

FIG. 3 is an enlarged cross-sectional view of region 'A1' indicated in FIG. 1, FIG. 4A is an enlarged plan view of region 'A2' indicated in FIG. 2 and FIG. 4B is a cross-sectional view of region A2.

Referring to FIG. 3, during method steps that form the molding portion 500, uncured (injected) resin associated with the molding portion 500 may surge or swell (e.g., in the direction indicated in FIG. 3 by the arrow 'R') up one side of the lower semiconductor chip 210 facing the spacer chip 220 to displace some portion of the inter-chip bonding layer 317 between the upper semiconductor chip 300 and the lower semiconductor chip 210, and potentially cover some portion of the lower surface of the upper semiconductor chip 300. With this intrusion of molding resin into unintended location(s), it is possible that during subsequent processing of the molding portion 500 may mechanical stress or damage the upper semiconductor chip 300 to the point of physical damage. That is, subsequently applied mechanical pressure used to form the molding portion 500 may damage delicate features of the upper semiconductor chip 300.

Referring to FIGS. 2 and 4A, the upper surface of the lower semiconductor chip 210 may include connection pads 213 arranged in one or more "connect edge region(s)" (e.g., area(s) of the upper surface of the lower semiconductor chip 210 near an edge (or lateral sidewall) of the lower semiconductor chip 210 including at least one connection pad 213). Thus, the bonding wires 215 may extend upward from the package substrate 100 near a connect edge region in order to connect one or more connection pads 213 disposed in the connect edge region. As a result, the physical presence of the bonding wires 215 rising to connect the connection pads 213 may act as an obstacle blocking (or impeding) the flow of resin associated with the molding portion 500.

In some contrast, other edge regions of the upper surface of the lower semiconductor chip 210 lacking connection pads 213 may be understood as "open edge regions" (or wire-free regions). Unlike connection edge region(s), open edge regions (OPA) allow resin associated with the molding portion 500 to readily flow into internal space(s), thereby potentially causing damage (e.g., cracking) as described above.

In order to prevent this outcome, the semiconductor package 10 may further include a dam structure 250 disposed in one or more open edge region(s) OPA of the upper surface of the lower semiconductor chip 210. In some embodiments, the dam structure 250 may include two or more dummy bumps 254 and at least one dummy wire 225, wherein the dummy bumps 254 may be arranged on the upper surface of the lower semiconductor chip 210 substantially along the outer edge of the lower semiconductor chip 210 and the dummy wire 225 may extend between adjacent ones of the dummy bumps 254.

As illustrated in FIGS. 3 and 4A, in the absence of the dam structure 250 within an open edge region OPA, material(s) (e.g., resin) introduced during the formation of the molding portion 500 (as indicated by the arrow R) may flow into internal space(s), such as those indicated by a second boundary BD2. In contrast, the presence of the dam structure 250 within the open edge region OPA may result in an arresting of resin flow such that only limited internal spaces bounded by a first boundary BD1 (e.g., the limited internal spaces between the outer edge of the lower semiconductor chip 210 and the dam structure 250) will be covered by the resin.

In this regard, the dam structure 250 of FIGS. 4A and 4B may effectively block any further inflow of resin (in the direction R) beyond the disposition of the dummy bumps 254 and dummy wires 225 within the open edge region.

Further in this regard, the dummy wires 225 may be understood as inactive wires, as compared with certain active wires with the semiconductor package 10, such as the bonding wires 215. In some embodiments, however, the dam structure 250 may be fabricated together with the bonding wires 215 (e.g., using a bonding process) without requirement of separate and additional fabrication process(es). Accordingly, the dummy wire(s) 225 and the dummy bump(s) 254 may include the same materials(s) as the bonding wires 215.

For example, as illustrated in FIGS. 4A and 4B, bonding wire(s) 215 may be drawn from respective conductive bump(s) 214 associated with connection pad(s) 213. And dummy wire(s) 225 and dummy bump(s) 254 may be formed, for example, using a similar capillary approach, but embodiments of the inventive concept are not limited thereto. Here, dummy wire(s) 225 and the dummy bump(s) 254 may include at least one of gold (Au), copper (Cu) and aluminum (Al), for example.

As illustrated in FIG. 4B, the connection pad 213 may be selectively exposed through a passivation layer 219 formed on the upper surface of the semiconductor substrate 211. Thereafter, the conductive bumps 214 may be formed on either the connection pad 213 or on the passivation layer 219. (In some embodiments, the connection pad 213 may be part of a wiring layer for the semiconductor substrate 211, not shown in FIG. 4B). Accordingly, in some embodiments, the dam structure 250 may be formed directly on the passivation layer 219.

In some embodiments, one or more dam structures 250 may be arranged in a pattern consistent with a pattern of arrangement for the connection pads 213 (e.g., column parallel to the outer edge of the lower semiconductor chip 210).

A pitch P (e.g., a distance measured in a horizontal direction) between adjacent dummy bumps 254 may range from about 0.1 μm to about 30 μm. A diameter D for each dummy bump 254 may range from about 0.1 mil to about 20 mil. (Here, the term "mil" denotes 1/1000 inch, or about 25.4 μm).

In some embodiments, a second height H2 of the dummy wires 225 may be substantially the same as a first height H1 of the bonding wires 215. (Here, a "height" may be understood as a distance measured in a vertical direction from an arbitrarily selected horizontal plane). In some embodiments, the second height H2 of the dummy wires 225 may range from about 80 to 120% of the first height H1 of the bonding wires 215. For example, as measured from the upper surface of the lower semiconductor chip 210, the second height H2 of the dummy wire 255 may range from about 1 mil to about 10 mil.

In some embodiments, the lower semiconductor chip 210 may be a processor chip and/or a memory chip. For example, the lower semiconductor chip 210 may include at least one of a microprocessor, a graphic processor, a signal processor, a network processor, a chipset, an audio codec, a video codec, an application processor, or a system-on-chip. Alternately, the lower semiconductor chip 210 may be a control chip driving one or more memory devices.

In some embodiments, the upper semiconductor chip 300 may be a volatile memory chip (e.g., a dynamic random access memory (RAM) (DRAM), a static RAM (SRAM), a thyristor RAM (TRAM), a zero capacitor RAM (ZRAM), and/or a twin transistor RAM (TTRAM)), and/or a non-volatile memory chip (e.g., a flash memory, a magnetic RAM (MRAM), a spin-transfer torque MRAM (STT-MRAM), a ferroelectric RAM (FRAM), a phase change RAM (PRAM), a resistive RAM (RRAM), a nanotube RRAM, a polymer RAM, a nano floating gate memory, a holographic memory, a molecular electronics memory, and/or an insulator resistance change memory).

As noted above, the upper semiconductor chip 300 may be bonded to the upper surfaces of the lower semiconductor chip 210 and the spacer chip 220S by the inter-chip bonding layer 317, and the upper semiconductor chip 300 may be disposed to cover at least respective parts of the upper surfaces of the lower semiconductor chip 210 and the spacer chip 220S, but the scope of the inventive concept is not limited thereto. Alternately, one or more additional semiconductor chip(s) not covered by the upper semiconductor chip 300 may be disposed on the package substrate 100.

Further as noted above, the disposition of the dam structure 250 may effectively prevent the inflow of material(s) (e.g., resin) associated with the molding portion 500 from deeply intruding into open edge region(s) among the edge regions of the lower semiconductor chip 210. As will be further highlighted hereafter, the dam structure 250 may be variously configured using a variety of material(s) and structure(s).

Figure 5:
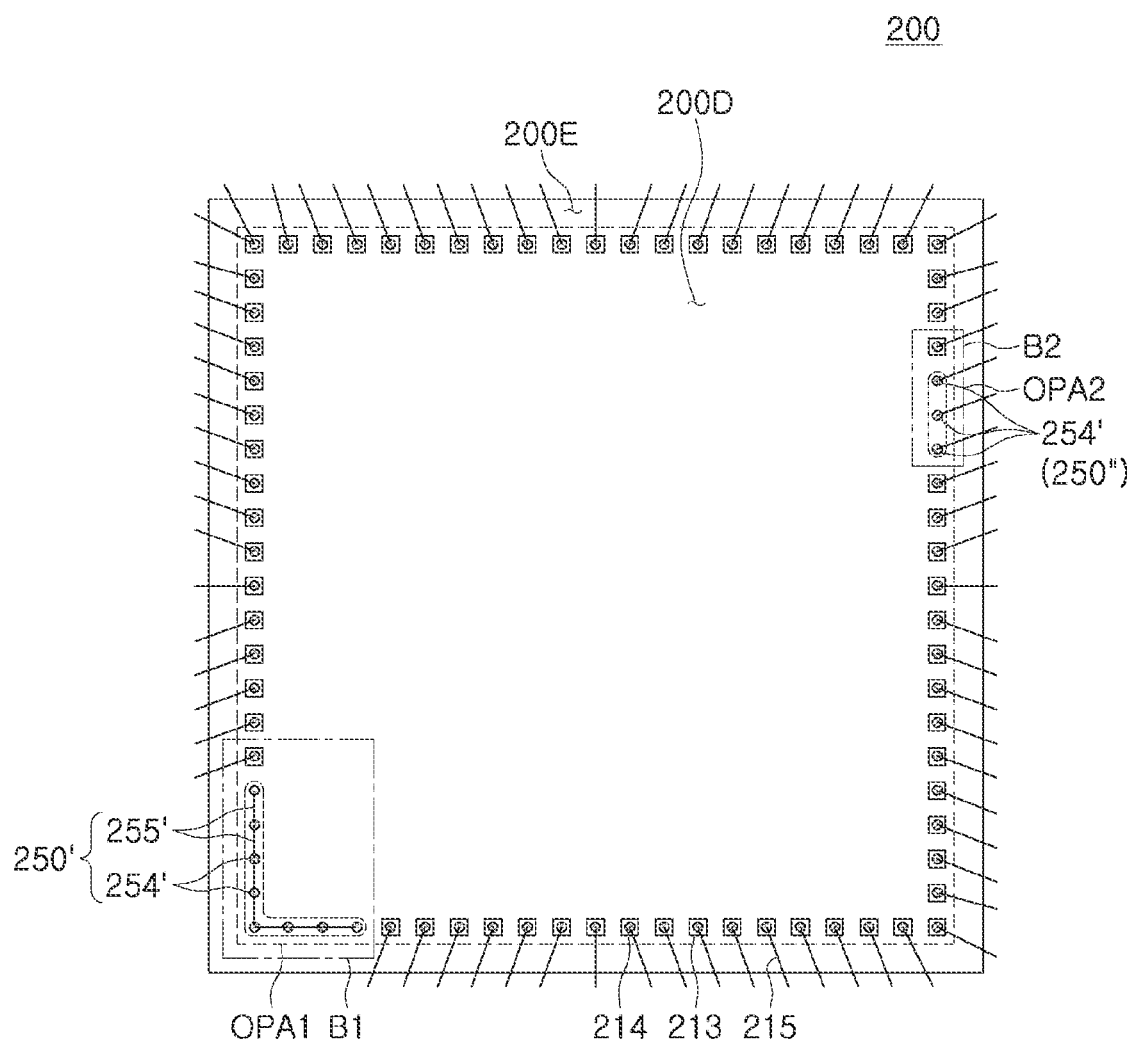
FIG. 5 is a plan view of a lower semiconductor chip that may be included in various embodiments of the inventive concept.
Figure 6A:
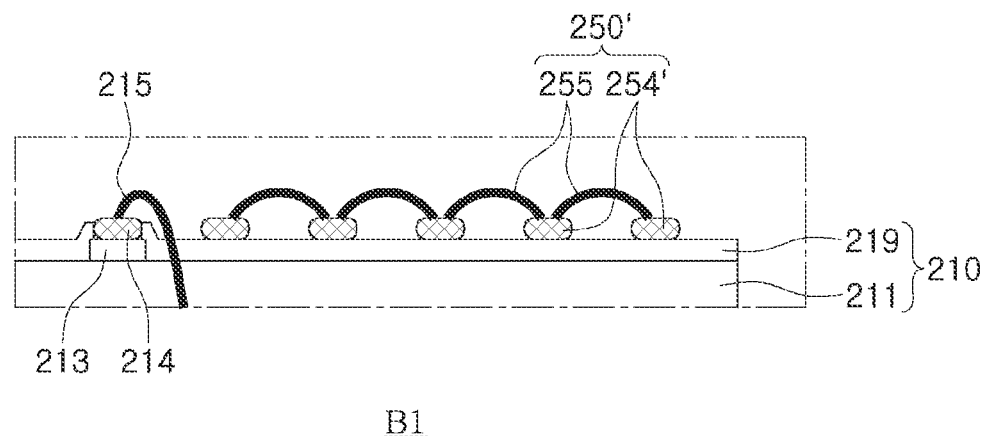
FIG. 6A is an enlarged cross-sectional view of region 'B1' indicated in FIG. 5.
Figure 6B:
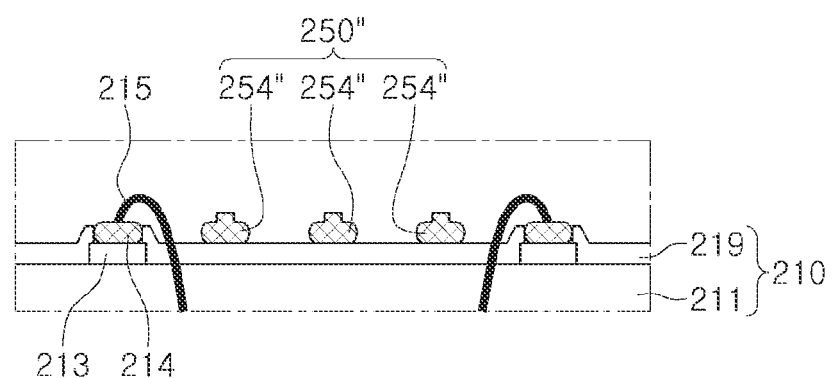
FIG. 6B is an enlarged cross-sectional view of region 'B2' indicated in FIG. 5.

FIG. 5 is a plan view of a lower semiconductor chip 200 that may be included in embodiments of the inventive concept, FIG. 6A is a cross-sectional view of region 'B1' indicated in FIG. 5, and FIG. 6B is a cross-sectional view of region 'B2' indicated in FIG. 5.

The lower semiconductor chip 200 may include a centrally-disposed device region 200D substantially overlapping an active region as well as a wiring layer used to electrically connect various elements and/or components in the active region. The lower semiconductor chip 200 may also include a peripheral region 200E substantially surrounding the device region 200D. Connection pads 213 may be arranged in one or more connect edge regions of an upper surface of the lower semiconductor chip 200. That is, the connection pads 213 may be variously arranged along one or more outer edges of the device region 200D near the peripheral region 200E.

In this regard, connection pads 213 may be substantially omitted from certain open edge regions defined along one or more sides or corners of the device region 200D. For example, the corner region B1 of FIG. 5 is a first open edge region (OPA1) and the side region B2 is a second open edge region (OPA2), wherein a first dam structure 250' may be formed in the first open edge region OPA1, and a second dam structure 250" may be formed in the second open region OPA2. In this regard, the first and second dam structures 250' and 250" may have very different structures.

Referring to FIG. 6A, the first dam structure 250' may include an arrangement of first dummy bumps 254' including a first part extending in a first horizontal direction along one side of the lower semiconductor chip 200 and a second part extending in a second horizontal direction intersecting the first horizontal direction along another side of the lower semiconductor chip 200. Further, the first dam structure 250' includes first dummy wires 255' respectively extending between adjacent ones of the first dummy bumps 254'.

Referring to FIG. 6B, the second dam structure 250" may include a linear arrangement of second dummy bumps 254" arranged along a portion of one side of the lower semiconductor chip 200. Here, however, each of the second dummy bumps 254" may include a protrusion vertically extending from an upper surface. With this configuration, dummy wires need not be included in the second dam structure 250", yet an inflow of resin associated with a molding portion into the second open area OPA2 may be blocked or sufficiently impeded.

Figure 7:
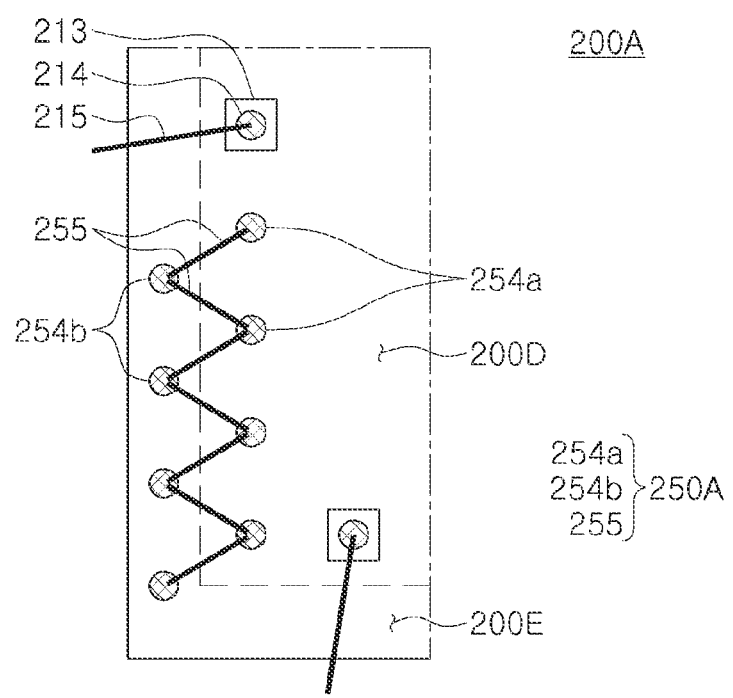
FIG. 7 is a plan view illustrating a dam structure that may be included in a lower semiconductor chip of various embodiments of the inventive concept.

FIG. 7 is a plan view illustrating a dam structure 250A that may be included in a lower semiconductor chip 200A according to embodiments of the inventive concept.

Heretofore, for clarity of basic description, it has been assumed that various dam structures include only one or more linear (e.g., straight line) arrangement(s) of constituent elements (e.g., bumps and wires). However, this need not always be the case, and other embodiments of the inventive concept may include relatively more complex arrangements of constituent elements.

Referring to FIG. 7, the lower semiconductor chip 200A is assumed to be substantially similar to the lower semiconductor chip 200A of FIG. 5, except where otherwise described. In this regard, the lower semiconductor chip 200A may include the dam structure 250A including first dummy bumps 254*a* and second dummy bumps 254*b* arranged in a zigzag pattern, and connected in a zigzag pattern by dummy wires 255. For example, first dummy bumps 254a may be arranged in a first column extending along an outer edge of the device region 200D and the second dummy bumps 254b may be arranged in a second column extending in a parallel direction with the arrangement of first dummy bumps 254a in the peripheral region 200E.

That is, the first dummy bumps 254a and the second dummy bumps 254b may be alternately disposed in two column in relation to an open edge region in a direction that blocks or impedes possible intrusion of resin associated with a molding portion. As illustrated in FIG. 7, one or more dummy wires 255 may extend in a zigzag pattern back-and-forth among the first dummy bumps 254a and the second dummy bumps 254b to form the dam structure 250A.

Figure 8A:
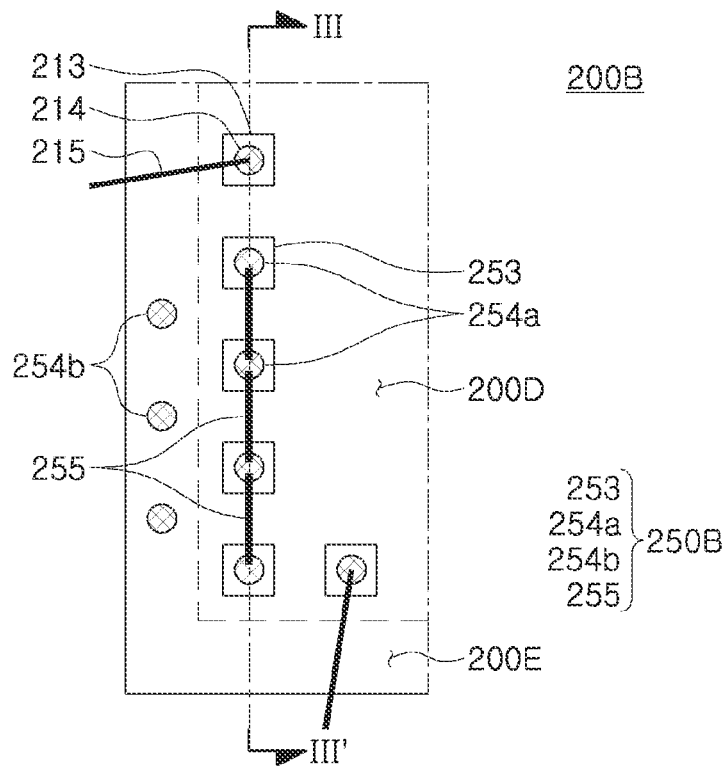
FIG. 8A is a plan view illustrating a dam structure that may be included in a lower semiconductor chip of various embodiments of the inventive concept.
Figure 8B:
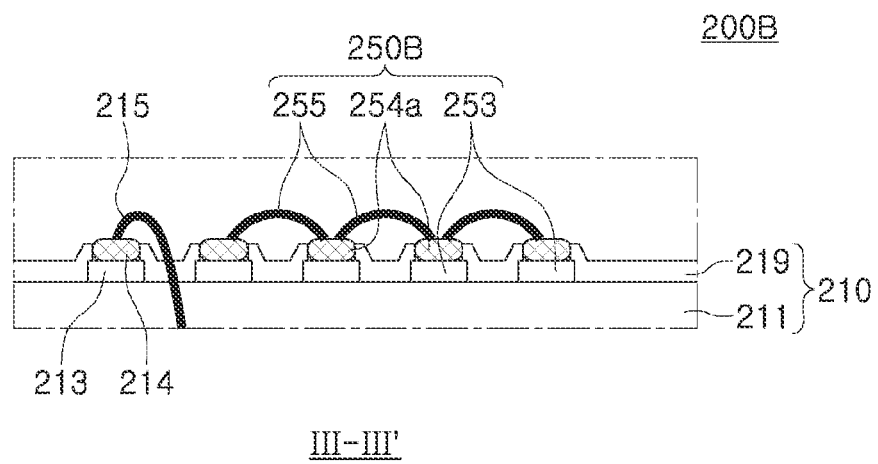
FIG. 8B is a cross-sectional view of the lower semiconductor chip of FIG. 8A taken along line III-III'.

FIG. 8A is a plan view illustrating another dam structure 250B that may be included in a lower semiconductor chip 200B according to embodiments of the inventive concept, and FIG. 8B is a cross-sectional view of the lower semiconductor chip 200B.

Here, analogous to the dam structure 250A of FIG. 7, the dam structure 250B may include first dummy bumps 254a arranged in a first column along an edge in the device region 200D, and second dummy bumps 254b arranged in a second column parallel with the first column along the edge in the peripheral region 200E.

However, in the illustrated example of FIGS. 8A and 8B, each of the first dummy bumps 254a may be respectively disposed on one of an arrangement of dummy pads 253. In this regard, the dummy pads 253 may be formed together with (e.g., using same semiconductor fabrication process (es)) the connection pads 213 during the manufacture of the lower semiconductor chip 200B. Here, however, the dummy pads 253 need not be connected to an active region, a wiring layer or a bonding wire. Instead, the dummy pads 253 may be provided to improve bonding strength of the first dummy bumps 254a. Thus, the first dummy bumps 254a may be more firmly bonded, as compared with bonding directly to the passivation layer 219. As shown in FIGS. 8A and 8B, the first dummy bumps 254a may be connected with dummy wires, but the second dummy bumps 254b may be left un-connected by dummy wires 255. In some embodiments, therefore, the first and second dummy bumps 254a and 254b arranged in parallel columns may nonetheless have different respective shapes.

Figure 9A:
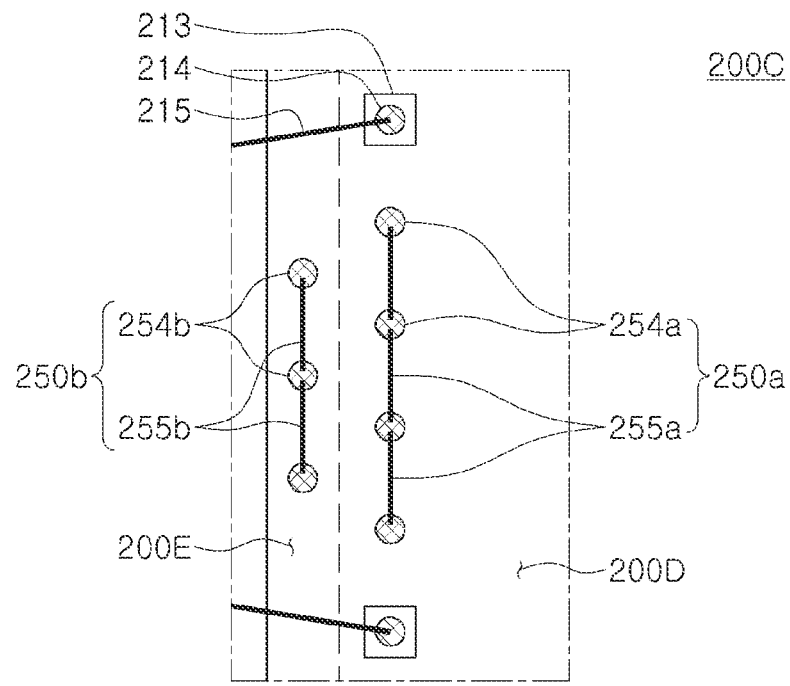
FIGS. 9A and 9B are respective plan views illustrating various dam structures that may be included in a lower semiconductor chip of various embodiments of the inventive concept.
Figure 9B:
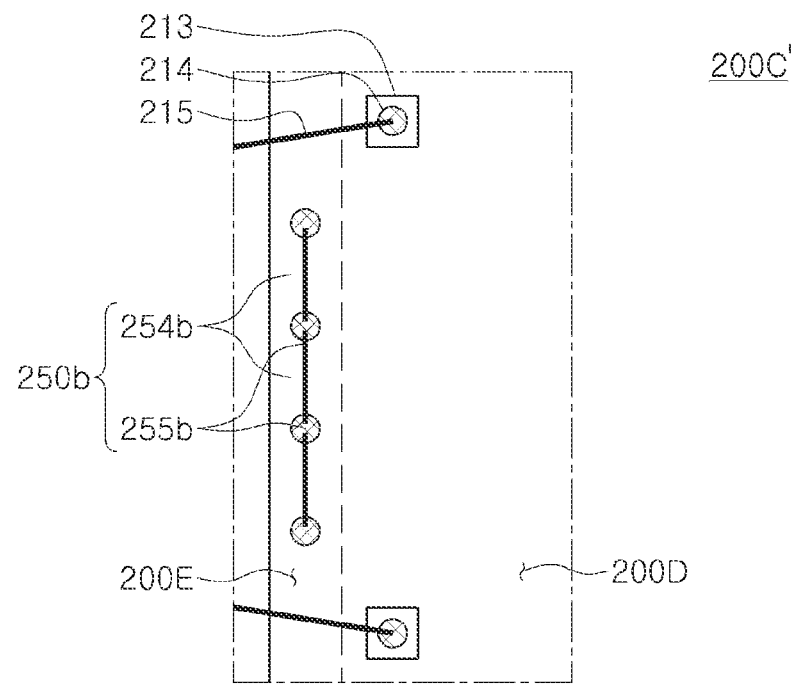

FIGS. 9A and 9B are respective plan views illustrating various dam structures that may be incorporated in lower semiconductor chips 200C and 200C' according to embodiments of the inventive concept.

Referring to FIG. 9A, the lower semiconductor chip 200C may include a double-column dam structure. Here, the double-column dam structure may include a first dam structure 250a including first dummy bumps 254a arranged in a first column within the device region 200D and first dummy wires 255a connecting adjacent ones of the first dummy bumps 254a, and a second dam structure 250b including second dummy bumps 254b arranged in a second column parallel to the first column within the peripheral region 200E and second dummy wire 255b connecting adjacent ones of the second dummy bumps 254b.

Referring to FIG. 9B, the lower semiconductor chip 200C' may include a single-column dam structure. Here, the single-column dam structure may include only the second dummy bumps 254b arranged in a column in the peripheral region 200E, and the second dummy wires 255b connecting adjacent ones of the second dummy bumps 254b.

Various dam structures consistent with embodiments of the inventive concept may be advantageously applied to various semiconductor packages. In this regard, some exemplary semiconductor packages will now be described in relation to FIGS. 10, 11, 12, 13, 14, 15, 16 and 17.

Figure 10:
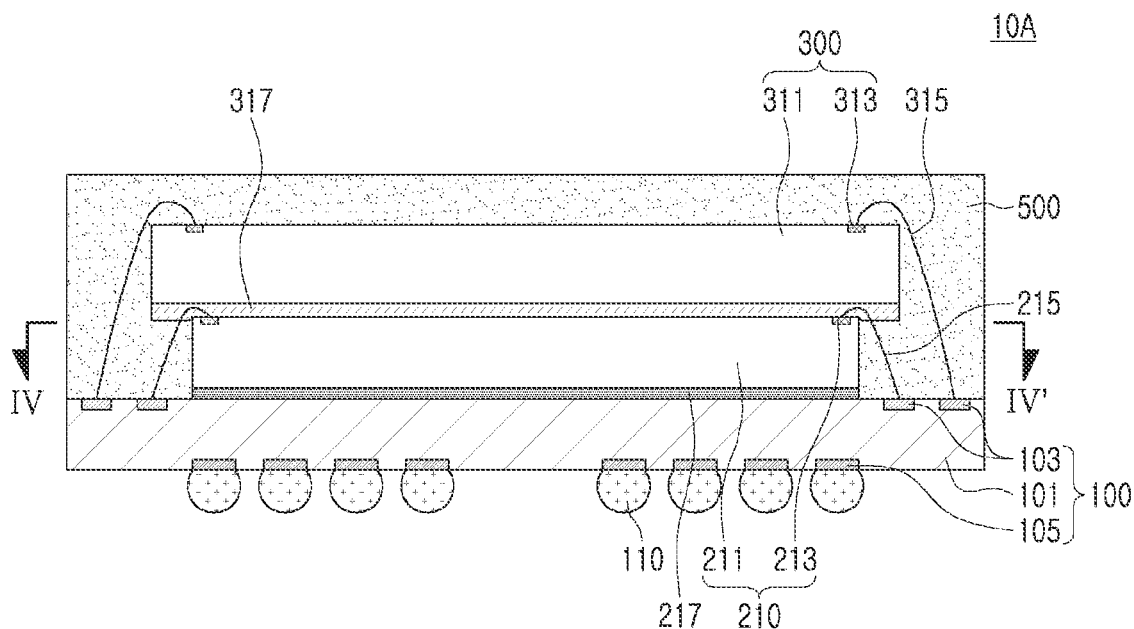
FIG. 10 is a cross-sectional view of a semiconductor package according to embodiments of the inventive concept.
Figure 11:
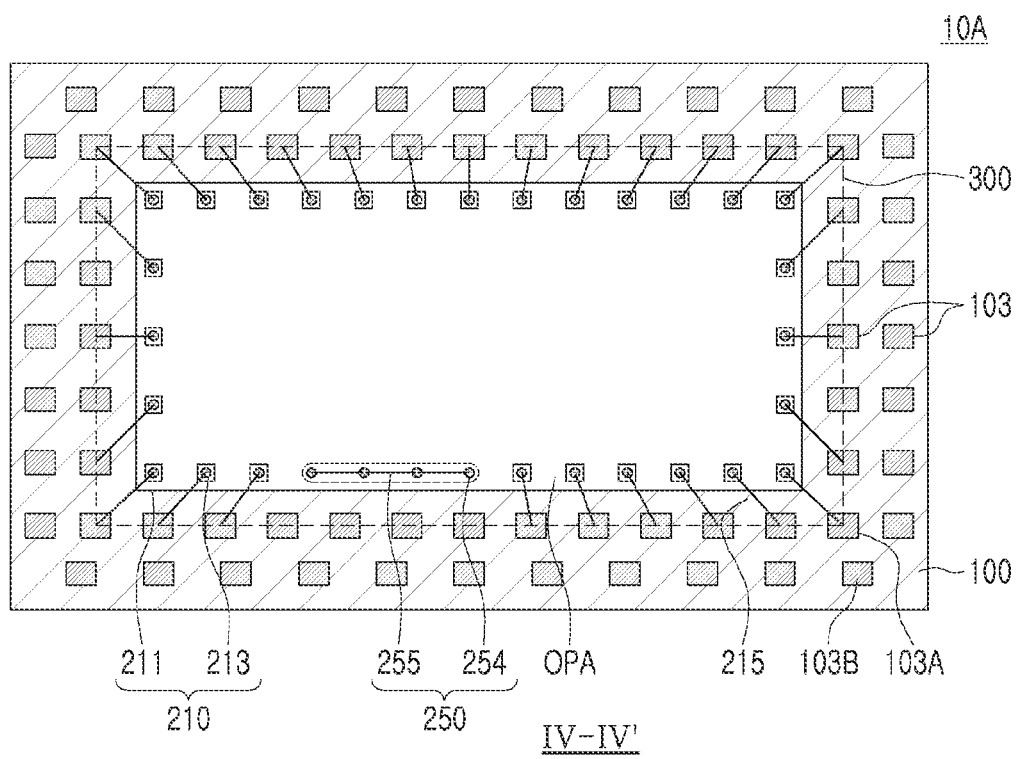
FIG. 11 is a plan view of the semiconductor package of FIG. 10 taken along line IV-IV'.

FIG. 10 is a cross-sectional side view of a semiconductor package 10A according to embodiments of the inventive concept, and FIG. 11 is a plan view of the semiconductor package 10A taken along line IV-IV'.

Referring to FIGS. 10 and 11, the semiconductor package 10A may include the package substrate 100, the lower semiconductor chip 210 disposed on the package substrate 100, and the upper semiconductor chip 300 disposed on the lower semiconductor chip 210. Here, although the lower semiconductor chip 210 is shown with a smaller lateral area (or footprint) than that of the upper semiconductor chip 300, embodiments of the inventive concept are not limited thereto, and in other embodiments the lateral area of the upper semiconductor chip 300 may be greater than that of the lower semiconductor chip 210.

As shown in FIG. 11, the semiconductor package 10A may further include a single-column dam structure 250 disposed in an open edge region OPA of an upper surface of the lower semiconductor chip 210. That is, the dam structure 250 may include dummy bumps 254 arranged in a column along an outer edge of one side of the upper surface of the lower semiconductor chip 210, and dummy wires 255 connecting adjacent ones of the dummy bumps 254. In some embodiments, the dummy wires 255 and/or the dummy bumps 254 may include the same material(s) used to form the bonding wires 215 (e.g., gold (Au), copper (Cu), and aluminum (Al)).

Figure 12:
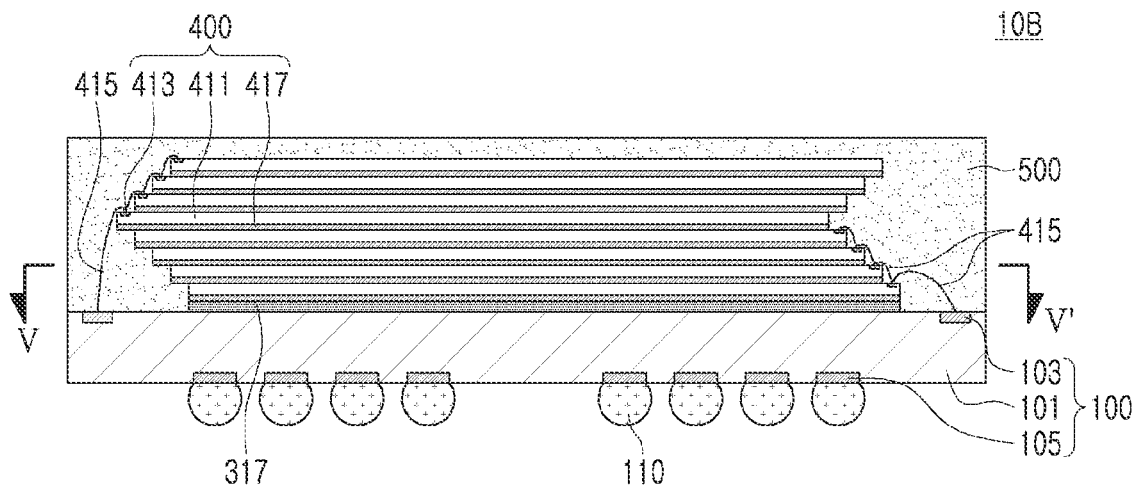
FIG. 12 is a cross-sectional view of a semiconductor package according to embodiments of the inventive concept.
Figure 13:
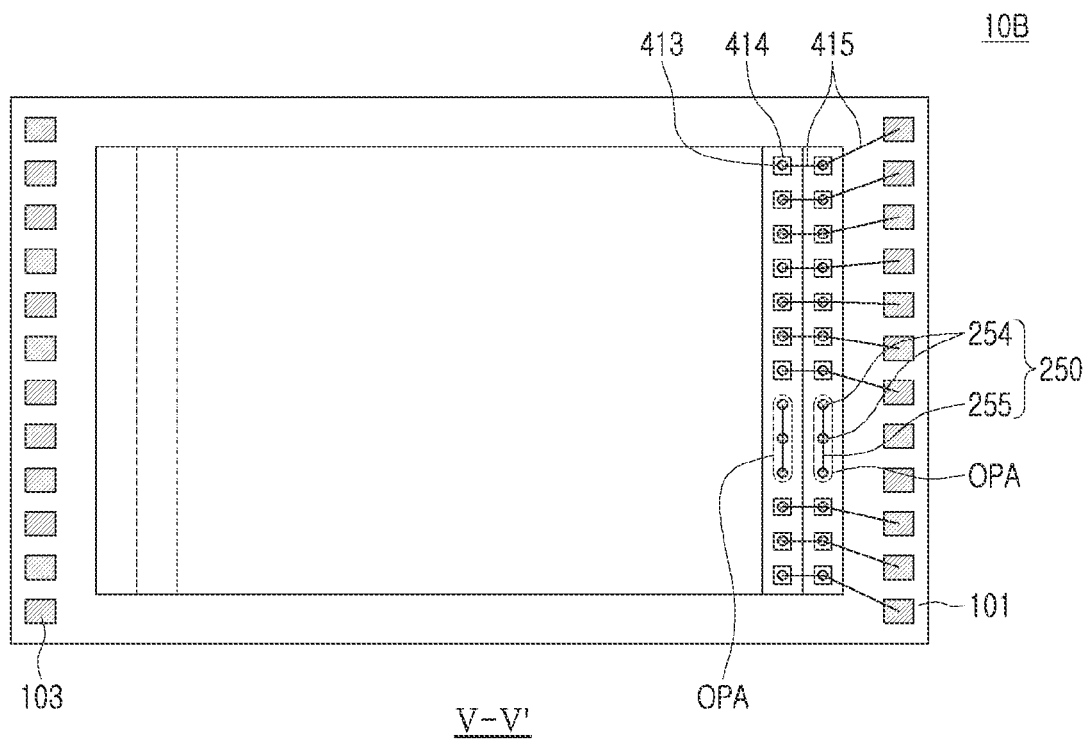
FIG. 13 is a plan view of the semiconductor package of FIG. 12 taken along line V-V'.

FIG. 12 is a cross-sectional side view of a semiconductor package 10B according to embodiments of the inventive concept, and FIG. 13 is a plan view of the semiconductor package 10B taken along line V-V'.

Referring to FIGS. 12 and 13, the semiconductor package 10B may be substantially similar to the embodiments previously described, except for the inclusion of a stacked plurality of semiconductor chips 411 forming a chip stack structure 400.

Accordingly, the semiconductor package 10B may include the package substrate 100 and the chip stack structure 400 disposed on the package substrate 100. Within the chip stack structure 400, two or more semiconductor chips 411 may be vertically stacked in a stepwise manner. In some embodiments, each of the semiconductor chips 411 may be a memory chip (e.g., a NAND flash memory chip and/or a DRAM chip). An inter-chip adhesive layer 417 may be variously interposed between adjacent ones of the semiconductor chips forming the chip stack structure 411. Here, the inter-chip adhesive layer 417 may be the same as, or substantially similar to, the non-conductive adhesive layer 317 (e.g., a direct adhesive film (DAF), a film over wire (FOW), etc.). Each of the semiconductor chips forming the chip stack structure 411 may include connection pads 413 disposed on an upper surface thereof, such that an adjacent semiconductor chip may be stacked on the exposed connection pads 413. Connection pads 413 between adjacent semiconductor chips 411 and upper pads 103 may be connected by bonding wires 415. That is, consistent with the foregoing description, bonding wires 415 may be used to connect connection pads 413 on a more upwardly disposed one of the semiconductors chips in the chip stack structure 411 to connection pads 413 on a lowest semiconductor chip among the semiconductor chips forming the chip structure 411 and/or the upper pads 103 of the package substrate 100.

As shown in FIG. 13, the semiconductor package 10B may also include at least one double-column dam structure 250 disposed on an upper surface of a semiconductor chip among the semiconductor chips forming the chip stack structure 411 having an open edge region OPA (e.g., an area lacking connection pads 413).

As with the foregoing embodiments, the dam structure 250 of FIGS. 12 and 13 may be arranged in a direction that effectively impedes or blocks an inflow of resin associated with the molding portion 500 in order to protect spaces between adjacent one of the semiconductor chips forming the chip stack structure 411. Further, the dummy wires 255 and/or the dummy bumps 254 may include the same material(s) used to form the bonding wires 415.

Figure 14:
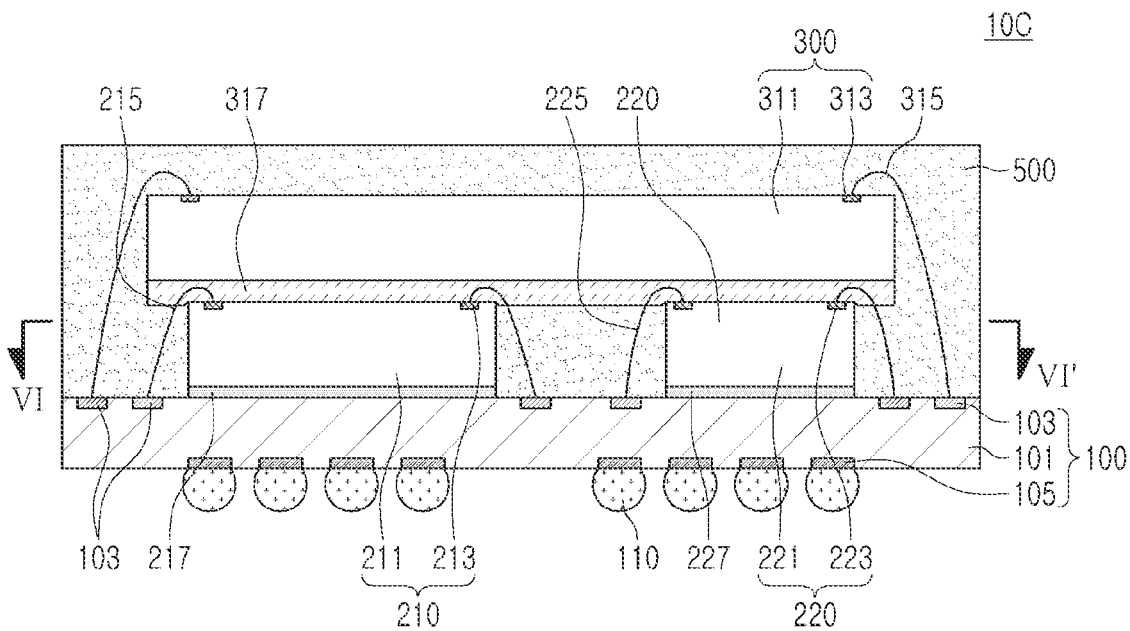
FIG. 14 is a cross-sectional view of a semiconductor package according to embodiments of the inventive concept.
Figure 15:
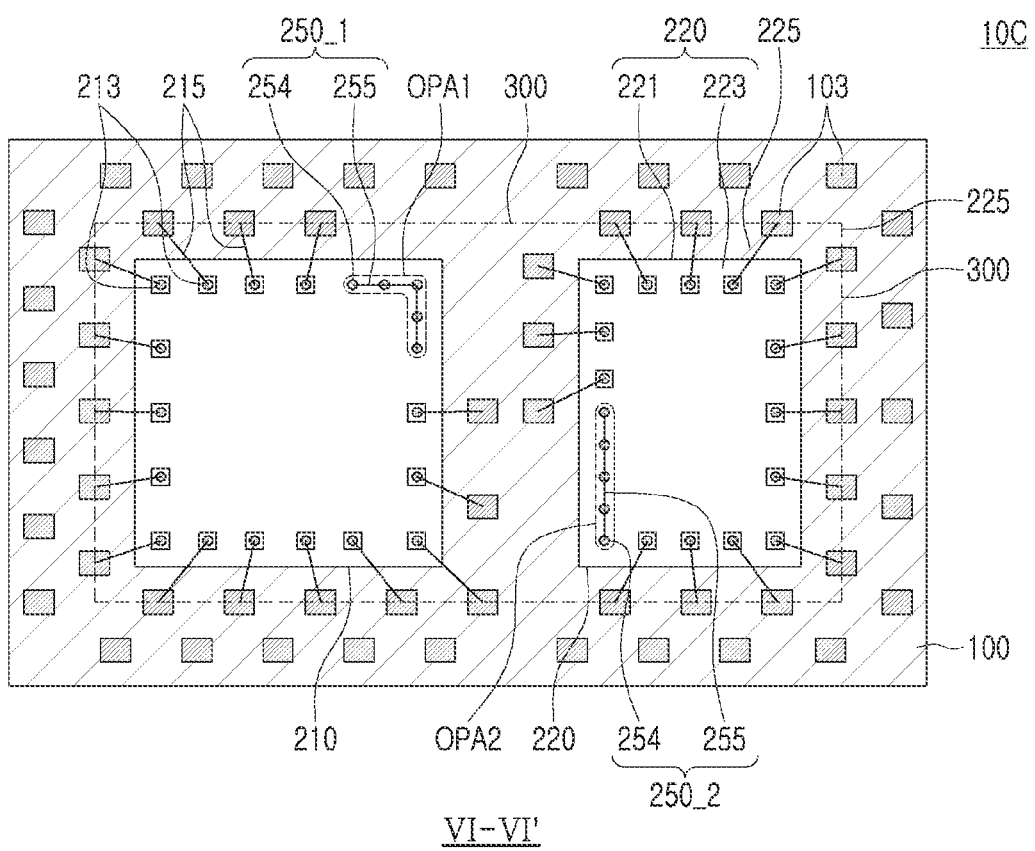
FIG. 15 is a plan view of the semiconductor package of FIG. 14 taken along line VI-VI'.

FIG. 14 is a cross-sectional view of a semiconductor package 10C according to embodiments of the inventive concept, and FIG. 15 is a plan view of the semiconductor package 10C taken along line VI-VI'.

Here, the semiconductor package 10C may include the package substrate 100, the first lower semiconductor chip 210 and a second lower semiconductor chip 220 disposed on the package substrate 100, and the upper semiconductor chip 300 disposed on upper surfaces of the first and second lower semiconductor chips 210 and 220.

Similar to the first lower semiconductor chip 210, the second lower semiconductor chip 220 may include a semiconductor substrate 221 having an active surface and an opposing inactive surface, and connection pads 223. The second lower semiconductor chip 220 may be bonded to an upper surface of the package substrate 100 using an adhesive layer 227.

Connection pads 213 and 223 of the first and second lower semiconductor chips 210 and 220 may be respectively connected to an upper pad 103 of the package substrate 100 by bonding wires 215 and 225. Of note, the first and second lower semiconductor chips 210 and 220 may serve as a lower structure that stably supports the upper semiconductor chip 300. An inter-chip bonding layer 317 may be disposed on a lower surface of the upper semiconductor chip 300, and the upper semiconductor chip 300 may be bonded to upper surfaces of the first and second lower semiconductor chips 210 and 220 using the inter-chip bonding layer 317.

As shown in FIG. 15, each of the first and second lower semiconductor chips 210 and 220 may include one or more open edge regions (e.g., a first open edge region OPA1 and a second open edge region OPA2). The first open region OPA1 may be a corner open edge region extending between adjacent sides of the second lower semiconductor chip 220, whereas the second open region OPA2 may be a linear open edge region extending partially along a single side of the first lower semiconductor chip 210.

Accordingly, a single-column, corner dam structure 2501 (analogous to the dam structure 250' of FIG. 5) may be provided in the first open edge region OPA1, and a single-column dam structure 250_2 (analogous to the dam structure 250" of FIG. 5) may be provided in the second open region. However, those skilled in will appreciate that one or both of the first dam structure 250_1 and the second dam structure might alternately be configured with a zigzag pattern, a double-column pattern, etc.

Figure 16:
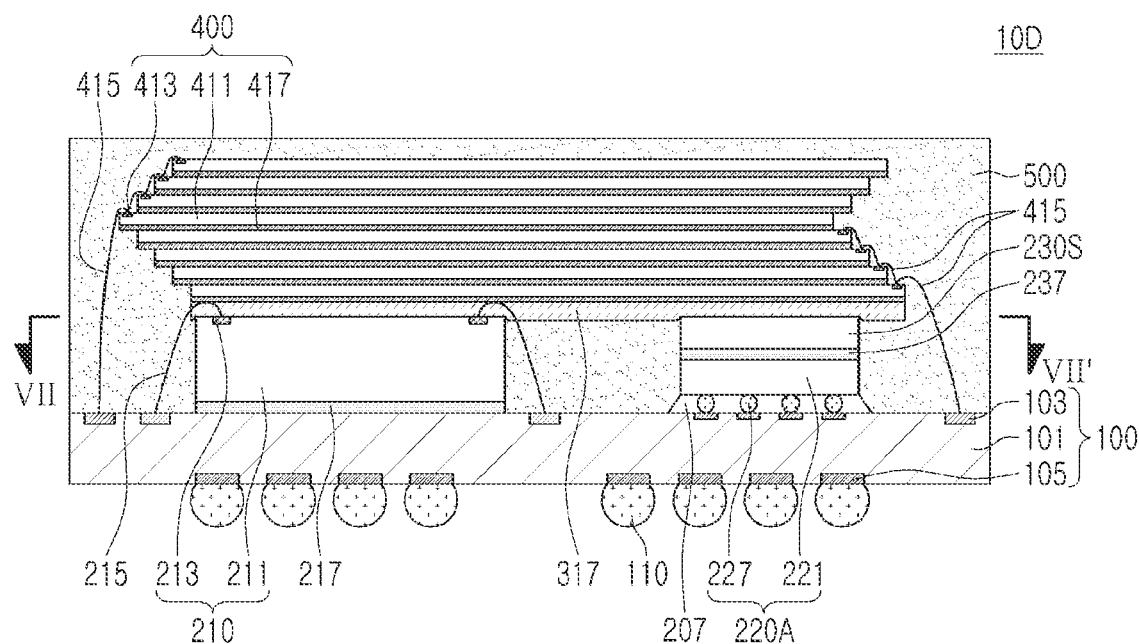
FIG. 16 is a cross-sectional view of a semiconductor package according to embodiments of the inventive concept.
Figure 17:
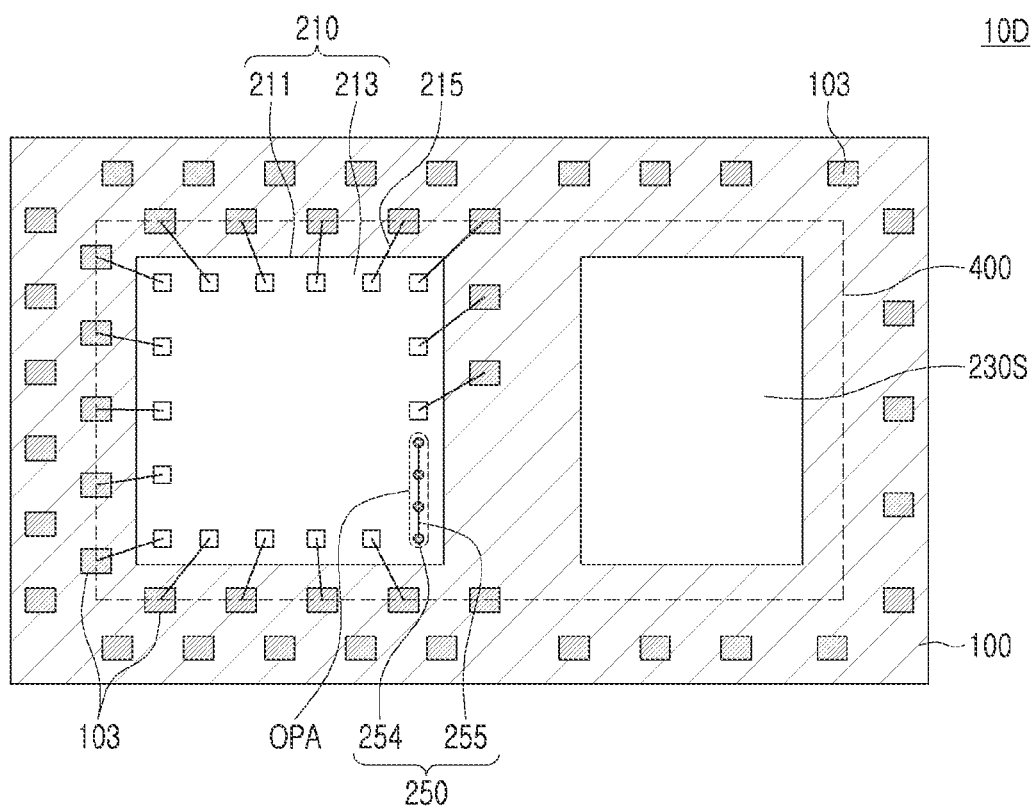
FIG. 17 is a plan view of the semiconductor package of FIG. 16 taken along line VII-VII'.

FIG. 16 is a cross-sectional view of a semiconductor package 10D according to embodiments of the inventive concept, and FIG. 17 is a plan view of the semiconductor package 10D taken along line VII-VII'.

Referring to FIGS. 16 and 17, the semiconductor package 10D may include an upper chip stack structure 400 disposed on an upper surface of a stacked combination of a spacer chip 230S and a second lower semiconductor chip 220A, as well as an upper surface of a first lower semiconductor chip 210. Here, the second lower semiconductor chip 220A may be connected to the package substrate 100 using solder balls 227 and an underfill 207 instead of (or in addition to) bonding wires.

Thus, the semiconductor package 10D may include the package substrate 100, first and second lower semiconductor chips 210 and 220A disposed on the package substrate 100, a spacer chip 230S disposed on an upper surface of the second lower semiconductor chip 220A, and an upper semiconductor chip 400 disposed on upper surfaces of the first lower semiconductor chip 210 and the spacer chip 230S.

Of note, given that different mounting heights for the first and second lower semiconductor chips 210 and 220A may be relatively large, such differences may be reduced by use of the spacer chip 230S disposed on the upper surface of the second lower semiconductor chip 220A. In this regard, the spacer chip 230S may be disposed on an active surface of the second lower semiconductor chip 220A using an adhesive layer 237. Using this approach, a height of the stacked combination of the second lower semiconductor chip 220A and the spacer chip 230S may be substantially similar to the height of the first lower semiconductor chip 210.

The upper semiconductor chip 400 may be bonded to an active surface of the first lower semiconductor chip 210 and an upper surface of the spacer chip 230S by an inter-chip bonding layer 317. The upper semiconductor chip 400 may be disposed to cover the active surface of the first lower semiconductor chip 210 and the upper surface of the spacer chip 230S.

The upper semiconductor chip 400 may be a chip stack structure similar to that previously described in relation to FIG. 12.

As shown in FIG. 17, the semiconductor package 10D may further include a dam structure 250 disposed in an open edge region OPA of the upper surface of the first lower semiconductor chip 210. The dam structure 250 may be a single-column dam structure as described above.

From the foregoing, those skilled in the art may readily appreciate that the provision of one or more dam structure(s) in open edge region(s) (e.g., bonding wire-free areas) of semiconductor chip(s) within a semiconductor package may greatly reduce or eliminate the risk of defects associated with unwanted inflow(s) of material(s) associated with a molding portion(s). Such dam structures may vary in size, geometry and configuration but may be generally configured from one or more arrangement(s) of dummy bumps within (or proximate to) the open edge region(s), wherein in some embodiments, the dummy bumps may be connected by dummy wires. Accordingly, the overall reliability of the semiconductor package may be markedly improved.

While example exemplary embodiments have been illustrated and described above, it will also be apparent to those skilled in the art that many modifications and variations may be made to same without departing from the scope of the inventive concept as defined by the appended claims.

What is claimed is:
1. A semiconductor package comprising:
a package substrate including an upper surface;
bonding pads arranged on the upper surface of the package substrate;
a lower semiconductor chip disposed on the upper surface of the package substrate, wherein an upper surface of the lower semiconductor chip includes a connect edge region and an open edge region;
connection pads arranged on the upper surface of the lower semiconductor chip in the connect edge region;

bonding wires respectively connecting the bonding pads and the connection pads;

a dam structure including dummy bumps disposed in the open edge region and dummy wires extending between adjacent ones of the dummy bumps;

an upper semiconductor chip disposed on the upper surface of the lower semiconductor chip;

an inter-chip bonding layer between the lower semiconductor chip and the upper semiconductor chip; and a molding portion on the package substrate and substantially surrounding the lower semiconductor chip and the upper semiconductor chip.

2. The semiconductor package of claim 1, wherein the dummy bumps are arranged in the open edge region along an edge of the upper surface of the lower semiconductor chip.

3. The semiconductor package of claim 1, wherein the dam structure includes a same material as the bonding wires.

4. The semiconductor package of claim 1, wherein the dummy bumps are arranged in at least one column.

5. The semiconductor package of claim 4, wherein the dummy bumps are arranged in two parallel columns, and the dam structure further includes dummy wires that alternatingly extend between dummy bumps in a zigzag pattern.

6. The semiconductor package of claim 4, wherein the dummy bumps arranged in the open edge region are aligned with the connection pads arranged in the connect edge region.

7. The semiconductor package of claim 1, wherein the dummy bumps are separated by a pitch ranging from 0.1 µm to 30 µm.

8. The semiconductor package of claim 1, wherein each of the dummy bumps has a diameter ranging from 0.1 mil to 20 mil.

9. A semiconductor package comprising:

a package substrate including an upper surface with a bonding pad;

a first lower semiconductor chip disposed on the upper surface of the package substrate, wherein an upper surface of the first lower semiconductor chip includes a connect edge region including a connection pad and an open edge region including a dam structure;

a bonding wire having a first height above the upper surface of the first lower semiconductor chip and connecting the bonding pad and the connection pad;

an upper semiconductor chip disposed on the upper surface of the first lower semiconductor chip using an inter-chip bonding layer; and a molding portion on the package substrate and substantially surrounding the first lower semiconductor chip and the upper semiconductor chip, wherein the dam structure includes dummy bumps disposed in the open edge region, and dummy wires extending between adjacent ones of the dummy bumps and having a second height above the upper surface of the first lower semiconductor chip.

10. The semiconductor package of claim 9, further comprising a second lower semiconductor chip disposed on the upper surface of the package substrate, the inter-chip bonding layer extending between the upper semiconductor chip and the second lower semiconductor chip, wherein the open edge region is disposed along an edge of the upper surface of the first lower semiconductor chip adjacent to the second lower semiconductor chip.

11. The semiconductor package of claim 9, wherein the second height of the dummy wires is 80% to 120% of the first height of the bonding wire.

12. The semiconductor package of claim 9, wherein the second height ranges from 1 mil to 10 mil above the upper surface of the first lower semiconductor chip.

13. The semiconductor package of claim 9, wherein the upper surface of the first lower semiconductor chip includes a device region surrounded by a peripheral region, first dummy bumps among the dummy bumps are arranged in a first column disposed in the device region, and second dummy bumps among the dummy bumps are arranged in a second column parallel to the first column and disposed in the peripheral region.

14. The semiconductor package of claim 13, wherein first dummy wires among the dummy wires extend between respective ones of the first dummy bumps.

15. The semiconductor package of claim 14, wherein second dummy wires among the dummy wires extend between respective ones of the second dummy bumps.

16. The semiconductor package of claim 9, wherein the first lower semiconductor chip includes a semiconductor substrate including an active region and a wiring layer electrically connected to the active region, and the upper surface of the first lower semiconductor chip includes a device region overlapping the active region and the wiring layer, and a peripheral region surrounding the device region.

17. The semiconductor package of claim 16, wherein the open edge region is wholly disposed in the device region.

18. The semiconductor package of claim 16, wherein the open edge region is at least partially disposed in the peripheral region.

19. A semiconductor package comprising:

a package substrate including an upper surface including bonding pads;

a lower semiconductor chip disposed on the upper surface of the package substrate, wherein an upper surface of the lower semiconductor chip includes a connect edge region including connection pads and an open edge region including a dam structure;

a spacer chip disposed on the upper surface of the package substrate;

an upper semiconductor chip disposed on the upper surface of the lower semiconductor chip and an upper surface of the spacer chip;

an inter-chip bonding layer between the upper semiconductor chip and the lower semiconductor chip and the spacer chip;

bonding wires respectively connecting the bonding pads and the connection pads; and a molding portion on the package substrate and substantially surrounding the lower semiconductor chip, the spacer chip and the upper semiconductor chip, wherein the dam structure includes at least two dummy bumps and at least one dummy wire connecting the at least two dummy bumps.

20. The semiconductor package of claim 19, wherein the upper semiconductor chip is a chip stack structure including a plurality of semiconductor chips.

* * * * *